United States Patent
Lee et al.

(10) Patent No.: US 8,320,137 B2
(45) Date of Patent: Nov. 27, 2012

(54) PRINTED CIRCUIT BOARD

(75) Inventors: Cheng-Hsien Lee, Taipei Hsien (TW); Yung-Chieh Chen, Tu-Cheng (TW); Shou-Kuo Hsu, Tu-Cheng (TW); Shin-Ting Yen, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 206 days.

(21) Appl. No.: 12/978,527

(22) Filed: Dec. 24, 2010

(65) Prior Publication Data
US 2012/0147579 A1    Jun. 14, 2012

(30) Foreign Application Priority Data
Dec. 9, 2010 (TW) .............................. 99142927 A

(51) Int. Cl.
H05K 7/02 (2006.01)
H05K 7/06 (2006.01)
H05K 7/08 (2006.01)
H05K 7/10 (2006.01)

(52) U.S. Cl. ........ 361/782; 361/763; 361/767; 174/259; 174/260

(58) Field of Classification Search .......... 361/767–784; 174/259–264
See application file for complete search history.

(56) References Cited

U.S. PATENT DOCUMENTS

| | | | |
|---|---|---|---|
| 4,891,616 A * | 1/1990 | Renken et al. | 333/236 |
| 5,430,166 A * | 7/1995 | Klein et al. | 556/428 |
| 6,388,208 B1 * | 5/2002 | Kiani et al. | 174/266 |
| 6,700,823 B1 * | 3/2004 | Rahman et al. | 365/189.05 |
| 2002/0179332 A1 * | 12/2002 | Uematsu et al. | 174/262 |
| 2004/0136141 A1 * | 7/2004 | Korony et al. | 361/306.3 |
| 2006/0081397 A1 * | 4/2006 | Enchi et al. | 174/260 |
| 2006/0272852 A1 * | 12/2006 | Carrier et al. | 174/261 |

* cited by examiner

Primary Examiner — Tuan T Dinh
(74) Attorney, Agent, or Firm — Altis Law Group, Inc.

(57) ABSTRACT

A printed circuit board includes a high-speed differential signal control chip, first to eighth coupling capacitor pads, first to fourth connector pads, a first transmission line, a second transmission line, a third transmission line, a fourth transmission line, first to eighth transmission lines, two ninth transmission lines, first and second vias, and first to fourth sharing pads. The printed circuit board is operable to selectively support multiple connectors.

3 Claims, 6 Drawing Sheets

PRINTED CIRCUIT BOARD

BACKGROUND

1. Technical Field

The present disclosure relates to printed circuit boards (PCBs) and, particularly, to a PCB selectively supporting four different connectors.

2. Description of Related Art

A computer motherboard includes hard disk drive (HDD) connectors to install HDDs, such as SAS (serial attached SCSI) HDDs and SATA (serial ATA) HDDs. The SAS and SATA HDDs can use a common peripheral component interconnection (PCI) chip for transmitting data, while the motherboard normally only supports connectors of one type, such that layout of the motherboard must be changed when the HDD type is changed, which increases costs.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
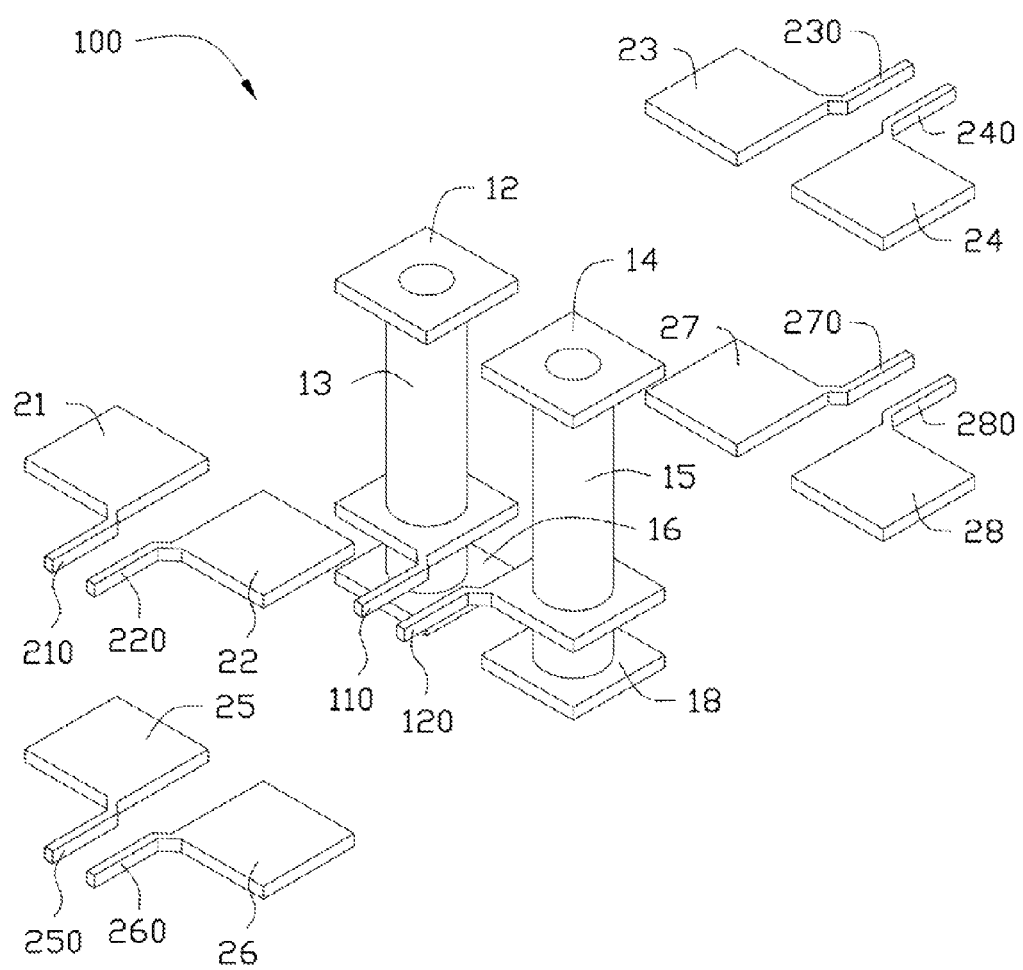
FIG. 1 is a schematic, isometric view of an embodiment of a printed circuit board (PCB).
Figure 2:
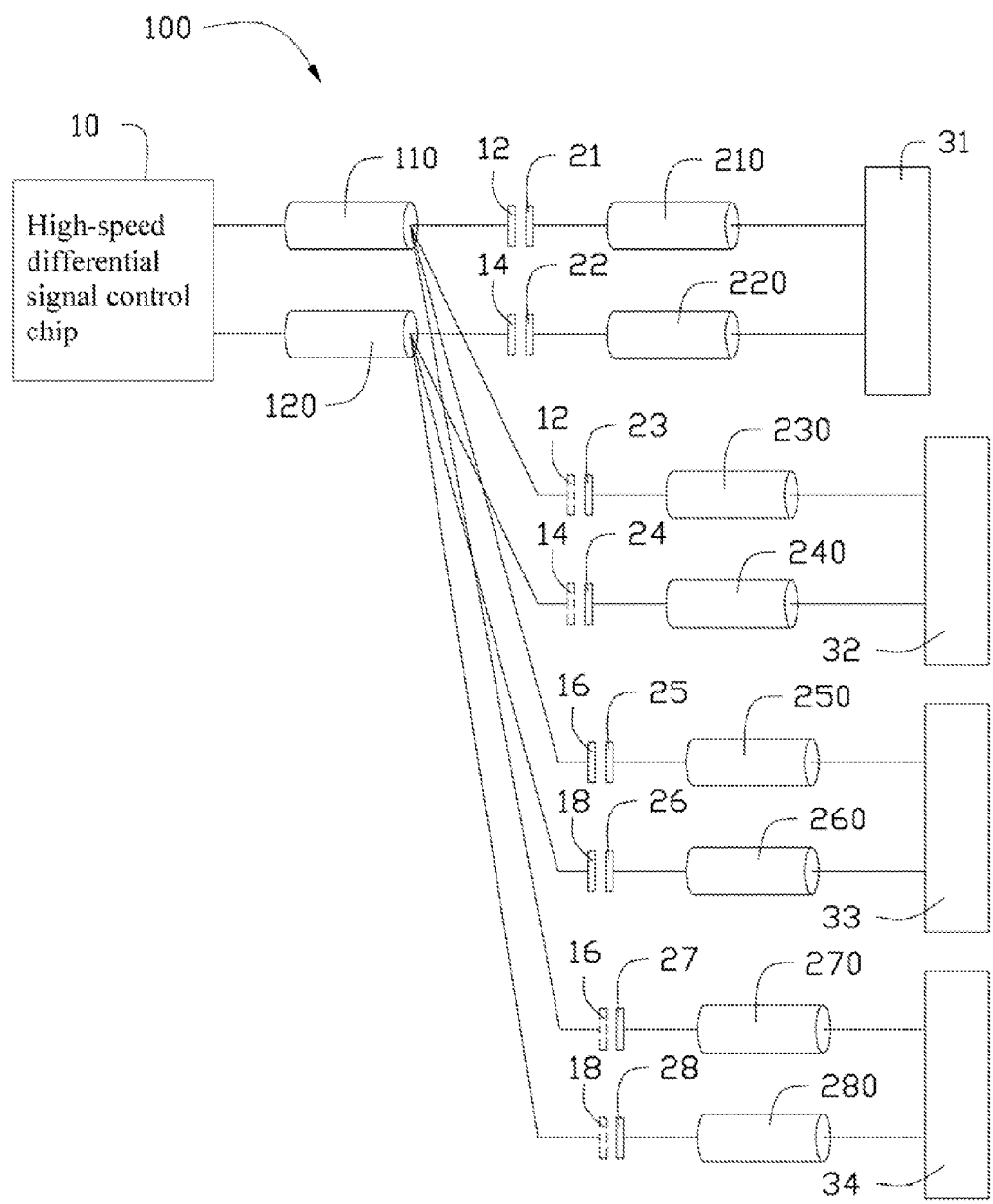
FIG. 2 is a circuit diagram of the PCB of FIG. 1.

Referring to FIGS. 1 and 2, an embodiment of a printed circuit board (PCB) 100 includes a high-speed differential signal control chip 10, first to eighth coupling capacitor pads 21-28, first to fourth connector pads 31-34, ten transmission lines 110, 120, 210, 220, 230, 240, 250, 260, 270, and 280, and first to fourth sharing pads 12, 14, 16, and 18. In one embodiment, the first and second connector pads 31 and 32, the transmission lines 210, 220, 230, and 240, the first to fourth coupling capacitor pads 21-24, and the first and second sharing pads 12 and 14 are arranged in a first layer of the PCB 100. The third and fourth connector pads 33 and 34, the transmission lines 250, 260, 270, and 280, the fifth to eighth coupling capacitor pads 25-28, and the third and fourth sharing pads 16 and 18 are arranged in a second layer of the PCB 100 below the first layer. The transmission lines 110 and 120 are arranged in a third layer between the first layer and the second layer of the PCB 100. The first sharing pad 12 is electrically connected to the third sharing pad 16 through a first via 13. The second sharing pad 14 is electrically connected to the fourth sharing pad 18 through a second via 15.

The first to fourth connector pads 31-34 are supported for different types of connectors (not shown), respectively for a first connector, a second connector, a third connector, and a fourth connector.

The chip 10 is arranged in the first layer or the second layer of the PCB 100. First terminals of the transmission lines 110 and 120 are connected to the chip 10, and second terminals of the transmission lines 110 and 120 are respectively connected to the first via 13 and the second via 15. First terminals of the transmission lines 210 and 220 are connected to two input terminals of the first connector pad 31. Second terminals of the transmission lines 210 and 220 are respectively connected to the first and second coupling capacitor pads 21 and 22. First terminals of the transmission lines 230 and 240 are connected to two input terminals of the second connector pad 32. Second terminals of the transmission lines 230 and 240 are respectively connected to the third and fourth coupling capacitor pads 23 and 24. First terminals of the transmission lines 250 and 260 are connected to two input terminals of the third connector pad 33. Second terminals of the transmission lines 250 and 260 are respectively connected to the fifth and sixth coupling capacitor pads 25 and 26. First terminals of the transmission lines 270 and 280 are connected to two input terminals of the fourth connector pad 34. Second terminals of the transmission lines 270 and 280 are respectively connected to the seventh and eighth coupling capacitor pads 27 and 28.

The first sharing pad 12 is arranged between the first and third coupling capacitor pads 21 and 23. The second sharing pad 14 is arranged between the second and fourth coupling capacitor pads 22 and 24. The third sharing pad 16 is arranged between the fifth and seventh coupling capacitor pads 25 and 27. The fourth sharing pad 18 is arranged between the sixth and eighth coupling capacitor pads 26 and 28.

Figure 3:
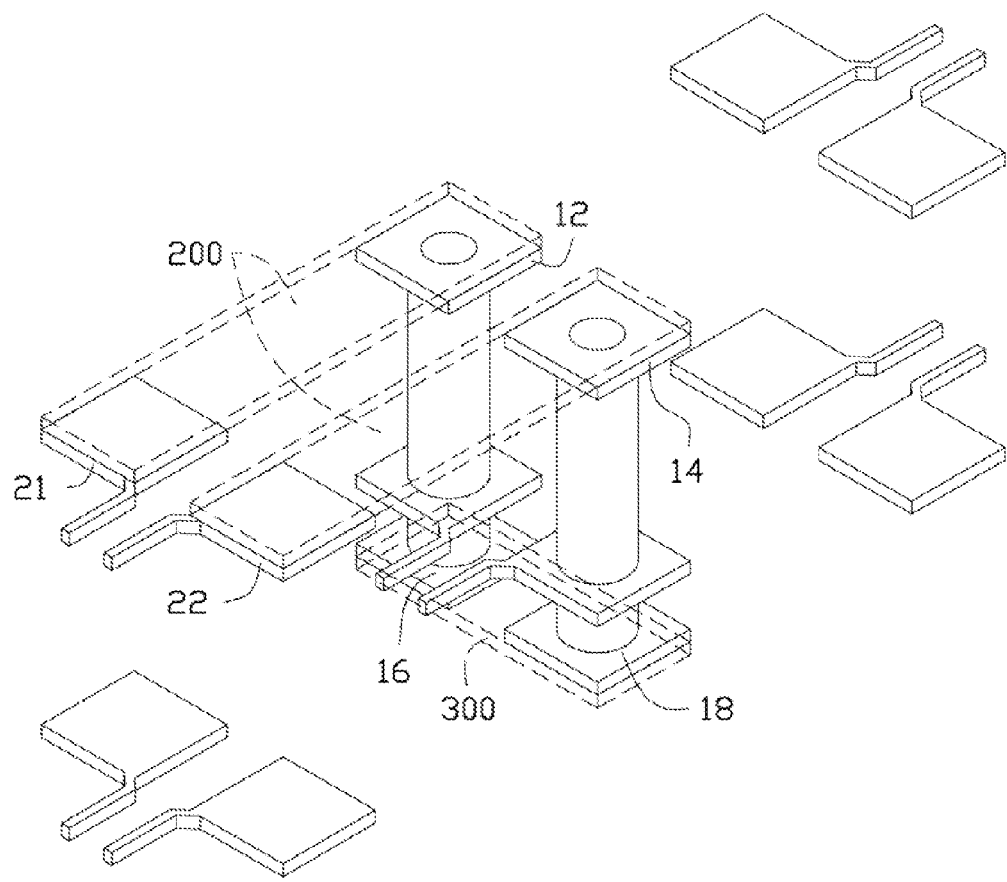
FIG. 3 is a schematic, isometric view of the PCB of FIG. 1, connected to a first connector pad.

Referring to FIG. 3, when the first connector is installed in the first connector pad 31, the third to eighth coupling capacitor pads 23-28 are void. Two coupling capacitors 200, such as alternating current (AC) coupling capacitors, are respectively connected to the first coupling capacitor pad 21 and the first sharing pad 12, and connected to the second coupling capacitor pad 22 and the second sharing pad 14. A bridge capacitor 300 is connected to the third sharing pad 16 and the fourth sharing pad 18. Thus, high-speed differential signals output by the chip 10 are transmitted to the first connector through the transmission lines 110 and 120, the first and second vias 13 and 15, the first and second sharing pads 12 and 14, the coupling capacitors 200, the first and second coupling capacitor pads 21 and 22, and the transmission lines 210 and 220 in order. The bridge capacitor 300 can decrease signal intensity of the high-speed differential signals output by the chip 10, to increase reliability thereof. In other embodiments, the bridge capacitor 300 can be omitted for conserving costs.

Figure 4:
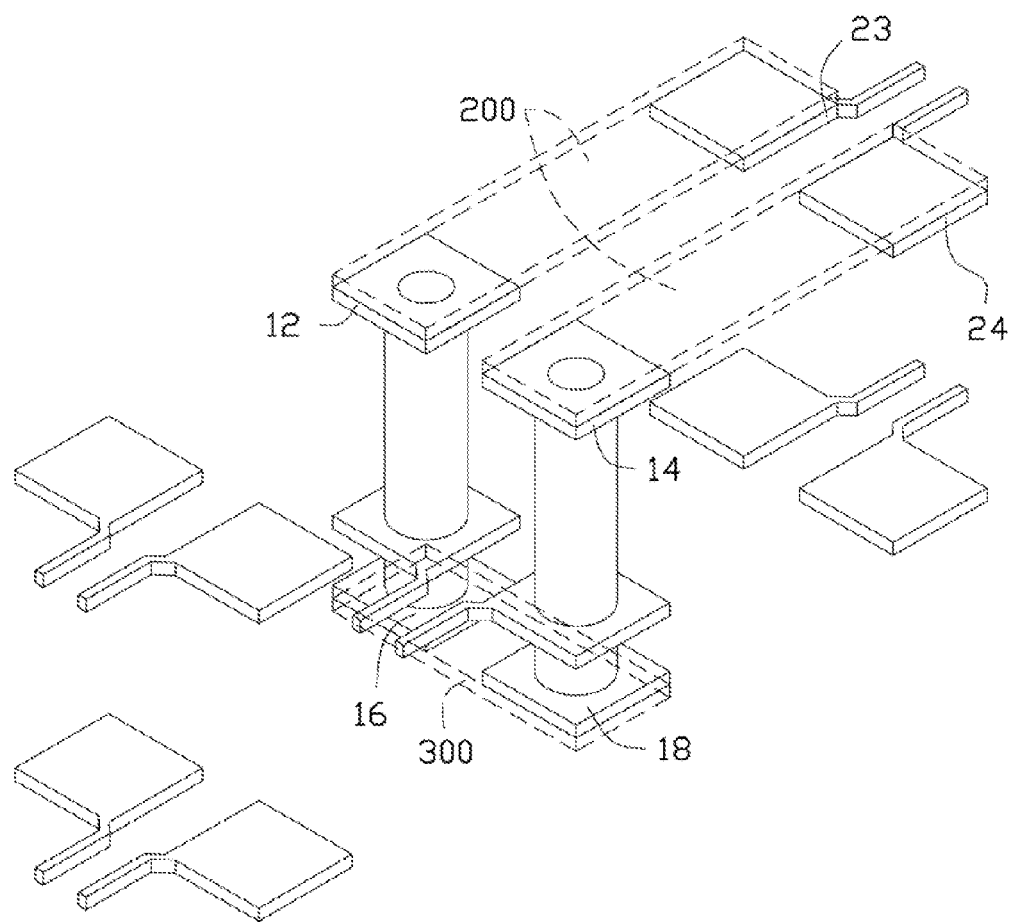
FIG. 4 is a schematic, isometric view of the PCB of FIG. 1, connected to a second connector pad.

Referring to FIG. 4, when the second connector is installed in the second connector pad 32, the first, second, and fifth to eighth coupling capacitor pads 21, 22, and 25-28 are void. Two coupling capacitors 200 are respectively connected to the third coupling capacitor pad 23 and the first sharing pad 12, and connected to the fourth coupling capacitor pad 24 and the second sharing pad 14. A bridge capacitor 300 is connected to the third sharing pad 16 and the fourth sharing pad 18. Thus, high-speed differential signals output by the chip 10 are transmitted to the second connector through the transmission lines 110 and 120, the first and second vias 13 and 15, the first and second sharing pads 12 and 14, the coupling capacitors 200, the third and fourth coupling capacitor pads 23 and 24, and the transmission lines 230 and 240 in order.

Figure 5:
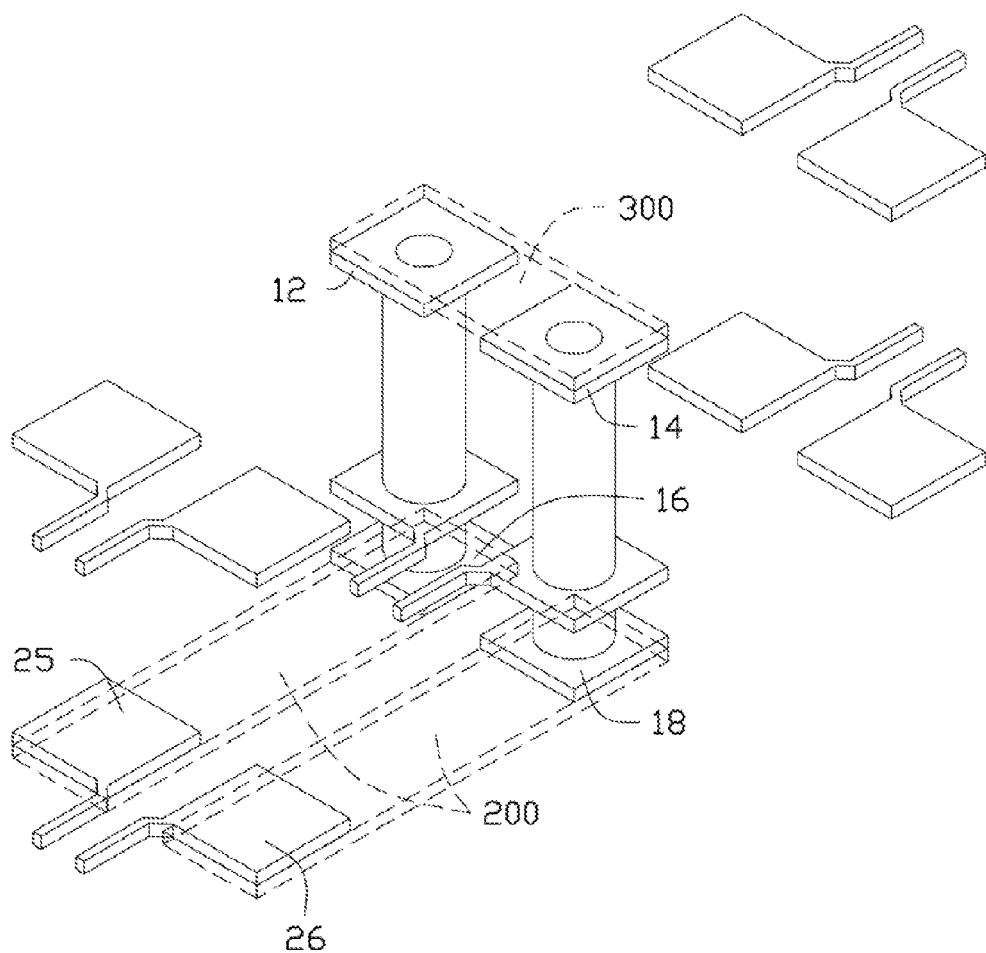
FIG. 5 is a schematic, isometric view of the PCB of FIG. 1, connected to a third connector pad.

Referring to FIG. 5, when the third connector is installed in the third connector pad 33, the first to fourth, seventh, and eighth coupling capacitor pads 21-24, 27, and 28 are void. Two coupling capacitors 200 are respectively connected to the fifth coupling capacitor pad 25 and the third sharing pad 16, and connected to the sixth coupling capacitor pad 26 and the fourth sharing pad 18. A bridge capacitor 300 is connected to the first sharing pad 12 and the second sharing pad 14. Thus, high-speed differential signals output by the chip 10 are transmitted to the third connector through the transmission lines 110 and 120, the first and second vias 13 and 15, the third and fourth sharing pads 16 and 18, the coupling capacitors 200, the fifth and sixth coupling capacitor pads 25 and 26, and the transmission lines 250 and 260 in order.

Figure 6:
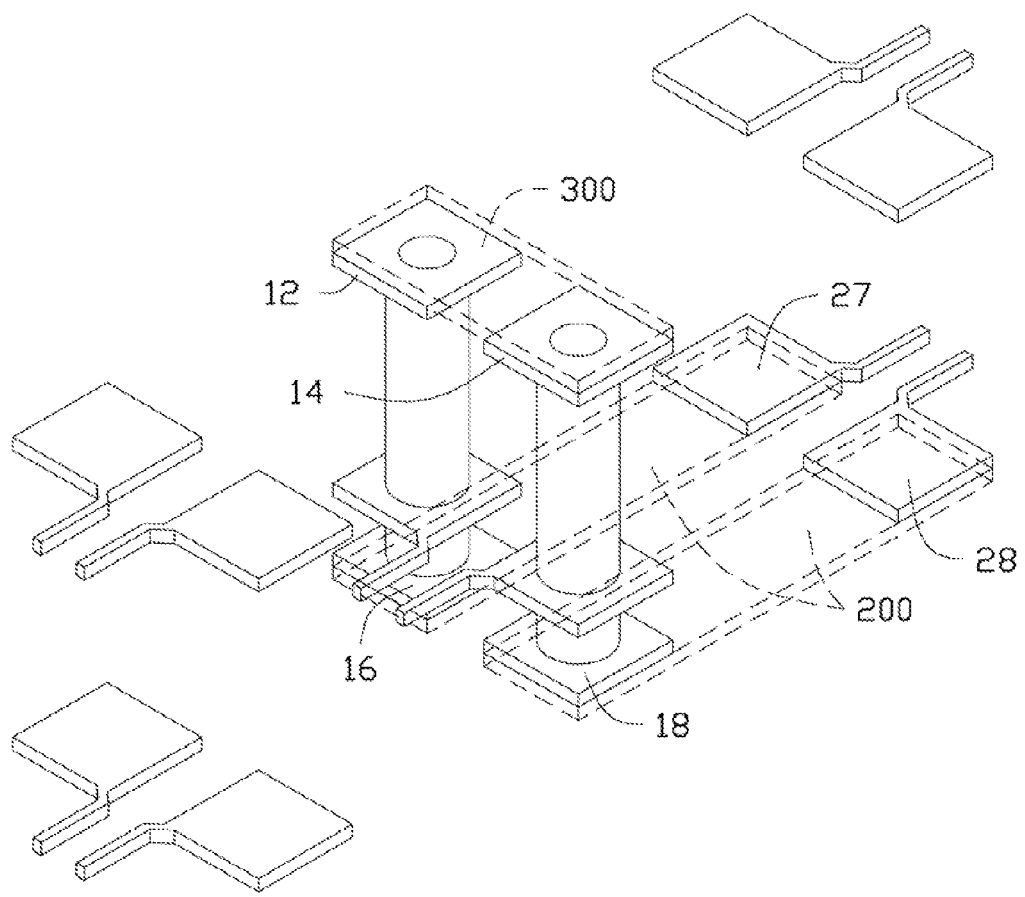
FIG. 6 is a schematic, isometric view of the PCB of FIG. 1, connected to a fourth connector pad.

Referring to FIG. 6, when the fourth connector is installed in the fourth connector pad 34, the first to sixth coupling capacitor pads 21-26 are void. Two coupling capacitors 200 are respectively connected to the seventh coupling capacitor pad 27 and the third sharing pad 16, and connected to the eighth coupling capacitor pad 28 and the fourth sharing pad 18. A bridge capacitor 300 is connected to the first sharing pad 12 and the second sharing pad 14. Thus, high-speed differential signals output by the chip 10 are transmitted to the fourth connector through the transmission lines 110 and 120, the first and second vias 13 and 15, the third and fourth sharing pads 16 and 18, the coupling capacitors 200, the seventh and eighth coupling capacitor pads 27 and 28, and the transmission lines 270 and 280 in order.

Thus, the PCB 100 is capable of flexibly supporting different types of connectors according to requirements, to decrease cost.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board (PCB) comprising:
a high-speed differential signal control chip;
a first to an eighth coupling capacitor pads;
a first to a fourth connector pads;
a first to an eighth transmission lines and two ninth transmission lines;
a first via and a second via; and
a first to a fourth sharing pads;
wherein the high-speed differential signal control chip, the first and second connector pads, the first to fourth transmission lines, and the first and second sharing pads are arranged in a first layer, the third and fourth connector pads, the fifth to eighth transmission lines, and the third and fourth sharing pads are arranged in a second layer below the first layer, the ninth transmission lines are arranged in a third layer between the first layer and the second layer, the first sharing pad is arranged between the first and third coupling capacitor pads, the second sharing pad is arranged between the second and fourth coupling capacitor pads, the third sharing pad is arranged between the fifth and seventh coupling capacitor pads, the fourth sharing pad is arranged between the sixth and eighth coupling capacitor pads;

wherein the first sharing pad is electrically connected to the third sharing pad through the first via, the second sharing pad is electrically connected to the fourth sharing pad through the second via, the high-speed differential signal control chip is connected to the first and second vias through the ninth transmission lines;

wherein first terminals of the first and second transmission lines are respectively connected to two input terminals of the first connector pad, second terminals of the first and second transmission lines are respectively connected to the first and second coupling capacitor pads, first terminals of the third and fourth transmission lines are respectively connected to two input terminals of the second connector pad, second terminals of the third and fourth transmission lines are respectively connected to the third and fourth coupling capacitor pads, first terminals of the fifth and sixth transmission lines are respectively connected to two input terminals of the third connector pad, second terminals of the fifth and sixth transmission lines are respectively connected to the fifth and sixth coupling capacitor pads, first terminals of the seventh and eighth transmission lines are respectively connected to two input terminals of the fourth connector pad, second terminals of the seventh and eighth transmission lines are respectively connected to the seventh and eighth coupling capacitor pads; and wherein two first coupling capacitors are operable to be selectively respectively connected to the first and second sharing pads and the first and second coupling capacitor pads, and respectively connected to the first and second sharing pads and the third and fourth coupling capacitor pads, two second coupling capacitors are operable to be selectively respectively connected to the third and fourth sharing pads and the fifth and sixth coupling capacitor pads, and respectively connected to the third and fourth sharing pads and the seventh and eighth coupling capacitor pads.

2. The PCB of claim 1, further comprising a bridge capacitor, wherein the bridge capacitor is operable to be connected to the third sharing pads and fourth sharing pads in response to the first and second sharing pads being connected to the first coupling capacitors.

3. The PCB of claim 1, further comprising a bridge capacitor, wherein the bridge capacitor is operable to be connected to the first sharing pads and second sharing pads in response to the third and fourth sharing pads being connected to the second coupling capacitors.

* * * * *